United States Patent
Bour et al.

(10) Patent No.: US 8,000,366 B2
(45) Date of Patent: Aug. 16, 2011

(54) LASER DIODE WITH HIGH INDIUM ACTIVE LAYER AND LATTICE MATCHED CLADDING LAYER

(75) Inventors: David P. Bour, Cupertino, CA (US); Christopher L. Chua, San Jose, CA (US); Noble M. Johnson, Menlo Park, CA (US); Zhihong Yang, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 244 days.

(21) Appl. No.: 12/276,173

(22) Filed: Nov. 21, 2008

(65) Prior Publication Data

US 2010/0127236 A1    May 27, 2010

(51) Int. Cl.
*H01S 5/00* (2006.01)
(52) U.S. Cl. ........... 372/45.01; 257/E33.023; 372/43.01
(58) Field of Classification Search .................. 257/103, 257/E33.023; 372/43.01, 45.01
See application file for complete search history.

(56) References Cited

U.S. PATENT DOCUMENTS

| | | | |
|---|---|---|---|
| 6,410,939 B1 * | 6/2002 | Koide et al. | 257/79 |
| 6,515,313 B1 * | 2/2003 | Ibbetson et al. | 257/103 |
| 6,556,603 B1 * | 4/2003 | Yamasaki et al. | 372/45.01 |
| 6,635,901 B2 * | 10/2003 | Sawaki et al. | 257/80 |
| 6,765,234 B2 * | 7/2004 | Koide | 257/88 |
| 7,692,209 B2 * | 4/2010 | Edmond et al. | 257/103 |
| 2005/0232323 A1 * | 10/2005 | Jewell | 372/45.011 |
| 2009/0218593 A1 * | 9/2009 | Kamikawa et al. | 257/103 |

OTHER PUBLICATIONS

R Butté et al., "Current status of AlInN layers lattice-matched to GaN for photonics and electronics" J. Phys. D: Appl. Phys. 40 (2007) 6328-6344, Oct. 5, 2007.
J. Wu et al., "Small band gap bowing in In1-xGaxN alloys" Applied Physics Letters vol. 80, No. 25pp. 4741 et seq., Jun. 24, 2002.
Schenk et al., "AlInN Optical Confinement Layers for Edge Emitting Group III-Nitride Laser Structures", WS6-Opto2: Technology and Devices, Session We6-A—Towards Blue-Green Lasers, pp. 245 (date uncertain).
Castella et al., "GaN-Based Laser Diodes Including a Lattice-Matched Al0.83In0.17N Bottom Cladding Layer", WS6-Opto2: Technology and Devices, Session We6-A—Towards Blue-Green Lasers, pp. 246 (date uncertain).
Brown et al., "Modeling multiple quantum barrier effects and reduced electron leakage in red-emitting laser diodes", J. App.Physics 100, 084509 (2006), Oct. 27, 2006.
Kawashima et al., "Optical properties of hexagonal GaN" J. Appl. Phys. 82 (7), pp. 3528 et seq., Oct. 1, 1997.

(Continued)

*Primary Examiner* — Allan R Wilson
(74) *Attorney, Agent, or Firm* — Jonathan A. Small

(57) ABSTRACT

A semiconductor laser diode with a high indium content is provided with a lattice matched cladding layer or layers. One or both of the cladding layers may comprise bulk aluminum gallium indium nitride in the ratio of $Al_xGa_{1-x-y}In_yN$ and/or a short period superlattice structures of, for example, a plurality of alternating layer pairs of aluminum gallium indium nitride in the ratio of $Al_xGa_{1-x-y}In_yN$ and gallium indium nitride in the ratio of $Ga_sIn_{1-s}N$, providing a multi-quantum barrier (MQB) effect. Lattice matching of the cladding layer(s) and active layer reduce or eliminate strain, and the materials chosen for the cladding layers optimizes optical and carrier confinement. Alternatively, the lattice parameters may be selected to provide strain balanced MQBs, e.g., where the barrier layers are tensile-strained and the well layers compressed.

6 Claims, 14 Drawing Sheets

OTHER PUBLICATIONS

Laws et al., "Improved refractive index formulas for the $Al_xGa1-xN$ and $In_yGa1-yN$ alloys", J. App.Physics 89, No. 2, pp. 1108 et seq., Jan. 15, 2001.

R Butté et al., "Recent Progress in the Growth of Highly Reflective Nitride-Based Distributed Bragg Reflectors and Their Use in Microcavities", Japanese Journal of Applied Physics vol. 44, No. 10, 2005, pp. 7207-7216 (2005), Oct. 11, 2005.

Terashima et al., "Growth and Characterization of AlInN Ternary Alloys in Whole Composition Range and Fabrication of InN/AlInN Multiple Quantum Wells by RF Molecular Beam Epitaxy", Japanese Journal of Applied Physics vol. 45, No. 21, 2006, pp. L539-L542 (2006).

Rennie et al., "Measurement of the Barrier Height of a Multiple Quantum Barrier (MQB)", IEEE Transactions on Quantum Electronics, vol. 30, No. 12, Dec. 1994.

\* cited by examiner

LASER DIODE WITH HIGH INDIUM ACTIVE LAYER AND LATTICE MATCHED CLADDING LAYER

STATEMENT REGARDING FEDERALLY SPONSORED RESEARCH AND DEVELOPMENT

The U.S. Government has a fully paid-up license in this disclosure and the right in limited circumstances to require the patent owner to license others on reasonable terms as provided for by the terms of contract number W911NF-08-C-0003 awarded by the United States Defense Advanced Research Projects Agency (DARPA).

BACKGROUND

The present disclosure is related to light emitting devices, and more specifically to a structure including an alternative cladding layer material used, for example, in devices emitting in the longer wavelengths, for example above 350 nm.

Semiconductor laser diodes (LDs) are compact, solid-state electronic devices capable of emitting light. A typical LD is comprised of a number of layers, including a lower and upper cladding layer, which provide optical confinement, and an active layer formed between these cladding layers. Typically, LDs are p-n junction devices, such that holes are injected from the p-region, and electrons are injected from the n-region. When electrons and holes combine in a depletion region between the p- and n-regions, a photon with energy equal to the difference between the electron and hole states is emitted. When a nearby photon with energy equal to the energy of the combining electron and hole ("recombination energy") is emitted it can cause further electron-hole recombination by stimulated emission. This generates another photon of the same frequency, travelling in the same direction, with the same polarization and phase as the first photon. This means that stimulated emission causes gain in an optical wave (of the correct wavelength) in the active region, and the gain increases as the number of electrons and holes injected across the p-n junction increases.

Of particular interest in this disclosure is the wavelength ($\lambda$) of emission of a LD. This wavelength ($\lambda$) of emission is in part a function of the materials from which the active region is formed.

Production of LDs emitting light at less than 350 nanometers (nm) is well understood. As used herein, devices emitting light at less than 350 nanometers (nm) are referred to as shorter wavelength LDs. And conversely, as used herein, devices emitting light at and above 350 nm are referred to as longer wavelength LDs. While production of shorter wavelength LDs is generally well known today, there is still much effort being put into the development of functional, practical longer wavelength LDs. There are many important applications of longer wavelength LDs. Examples of such applications include optical recording and playback, xerography, optical communications, color displays (e.g., television and computer displays), etc.

Nitride-based materials have been used as an active region in LDs for commercial, longer wavelength devices. Gallium indium nitride (GaInN) is an example of such a material. However, although nitride ultraviolet ($\lambda<380$ nm), near-UV ($\lambda\approx405$ nm), and violet-blue (405 nm$\leq\lambda\leq$470 nm) LDs have been demonstrated and produced commercially, their performance is not optimal and deteriorates with an increase in wavelength.

The sources of reduced LD performance at longer wavelengths are numerous. First, longer wavelengths imply an active GaInN region of higher indium content. When used as active regions, these alloys experience greater strain with respect to the gallium nitride (GaN) template they are typically formed upon. The higher strain is responsible for structural defects that affect the internal quantum efficiency. The greater strain is also responsible for a greater piezoelectric field across the quantum wells, which also reduces the radiative efficiency by separating the injected electrons and holes.

Furthermore, every material and material system has an inherent refractive index. For example, in the well known LD systems, a materials change in one layer results in a change in the refractive index of that layer. The refractive index difference between adjacent layers is critical to the mode shape, and hence efficiency, of the LD devices. A change in refractive index of only one layer of an adjacent pair changes that relative difference. As the actively layer indium content is increased the refractive index of that layer changes, and accordingly the relative index difference between the active layer and the adjacent cladding layer(s) change.

FIG. 1 is an illustration of device attributes of a generic nitride laser diode structure, and FIG. 2 shows a cross-section of such a generic nitride laser diode structure 20. Portion 12 of FIG. 1 shows a bandgap-energy representation, and portion 14 shows the corresponding refractive index profile associated with this structure.

FIG. 2 shows a cross section of such a device 20 including: sapphire ($Al_2O_3$) substrate 22, gallium nitride (GaN) template layer 23, lower aluminum gallium nitride (AlGaN) cladding layer 24, GaN or gallium indium nitride (GaInN) multiple quantum well (MQW) active layer 26, AlGaN electron blocking layer (EBL) 28, p-type GaN waveguide 30, AlGaN upper cladding layer 32, and GaN ohmic contact 34. Alternatively, substrate 22 may be comprised of GaN (not shown) in which case no additional GaN buffer layer need by used.

An optimized LD structure achieves both strong carrier confinement and optical confinement. The carrier confinement is realized by including high-bandgap alloys in the active region heterostructure (a structure comprised of at least two layers or regions of dissimilar crystalline semiconductors), specifically in the cladding layers surrounding the quantum well active layer. A cladding layer having a low refractive index produces strong optical confinement. Thus, as the active layer allow changes, compensation must be made in the cladding layers to maintain carrier confinement and optical confinement. One known approach to maintaining carrier and optical confinement is to substitute indium in the cladding layers for aluminum as the indium content in the active layer increases.

FIG. 3 shows the dispersion for GaN, and families of GaInN and AlGaN alloys, for example as used in the cladding layer of a LD heterostructure. For a typical range of alloys available to form a laser heterostructures at the longer wavelengths of 405 and 500 nm, the corresponding refractive index band is highlighted by the labeled vertical bars. That is, the bars indicate the range of alloys and refractive indices available to form conventional 405 nm and 500 nm nitride laser diodes, respectively. At longer wavelengths, the index range is smaller, unfortunately yielding weaker transverse optical mode confinement.

The poor optical confinement of a known 500 nm GaInN laser structure is illustrated in FIG. 4, which shows the aggregate maximum optical confinement factor ($\Gamma$, defined as the spatial overlap between the quantum well gain and the normalized optical mode) values for transverse waveguiding simulations of two laser structures, 405 nm emission and 500 nm emission, respectively. The structure of each of the devices is summarized in Table 1.

TABLE 1

|  | 405 nm | 500 nm |
|---|---|---|
| cladding | $Al_{0.07}Ga_{0.93}N$ | $Ga_{0.90}In_{0.10}N$ |
| SCH (opt. Γ) | $Ga_{0.90}In_{0.10}N$ | $Ga_{0.89}In_{0.11}N$ |
| Barriers (10 nm) | $Ga_{0.98}In_{0.02}N$ | $Ga_{0.88}In_{0.12}N$ |
| QWs (3 nm) | $Ga_{0.90}In_{0.10}N$ | $Ga_{0.73}In_{0.27}N$ |
| EBL (15 nm) | $Al_{0.20}Ga_{0.80}N$ | $Al_{0.05}Ga_{0.95}N$ |

Due in part to the substitution of In for Al in the cladding layers, the 500 nm LD structure in this example is designed to have similar strain as a conventional 405 nm LD, as well as similar bandgap energy differences for adequate carrier confinement. More specifically, the cladding layer is assumed to be semi-infinite $Ga_{0.90}In_{0.10}N$, the barriers are 10 nm thick $Ga_{0.88}In_{0.12}N$, the quantum wells (QWs) are 3 nm thick $Ga_{0.73}In_{0.27}N$, and the electron blocking layer (EBL) is 15 nm thick $Ga_{0.95}In_{0.05}N$. For this structure, the optical confinement factor was calculated for structures with different numbers of QWs (N=1, 2, 3, or 4). For each case, the $Ga_{0.89}In_{0.11}N$ separate-confinement heterostructure (SCH) thickness was adjusted for maximum optical confinement factor Γ.

Note from FIG. 4 that the Γ values for the 500 nm laser are roughly half that of the 405 nm laser. High Γ represents desirable device performance, and the indicated values for the 500 nm device are below practicable values. This dictates that a larger number of QWs would be required to provide sufficient modal gain; this would also translate to a higher threshold current. Neither of these modifications are desirable.

Therefore, the range of alloy compositions available to form such heterostructures is limited. The three interrelated challenges which have heretofore limited production of practical longer wavelength LDs are: (1) the smaller refractive-index differences (i.e., lower dispersion) of GaInN alloys (for the active region) at longer wavelengths; (2) the longer wavelength itself (since the mode size scales with wavelength); and (3) the strain limitations that may preclude using aluminum gallium nitride (AlGaN) cladding layers (which are tensile-strained and prone to cracking).

Accordingly, described herein is an alternative nitride laser structure providing acceptable carrier and optical confinement for longer wavelength operation. Investigations into alternative upper cladding layers has led to the realization that such alternative cladding layers may have applicability not only in the longer wavelength devices, but in many other devices such as those emitting in the violet-blue region.

SUMMARY

Accordingly, the present disclosure is directed to a semiconductor laser diode structure including a high indium content active layer and a lattice matched or nearly lattice matched cladding layer(s). Lattice matching of the cladding layer(s) and active layer or of the cladding layer(s) and the substrate reduce or eliminate strain, and the materials chosen for the cladding layers optimizes optical and carrier confinement.

According to one aspect of the disclosure, the laser diode structure comprises a gallium nitride (GaN) template layer; a lower cladding layer formed over the gallium nitride (GaN) template layer, the lower cladding layer comprising at least aluminum gallium indium nitride (AlGaInN); an active layer comprised of gallium indium nitride (GaInN) formed over the lower cladding layer; and an upper cladding layer formed over the active layer, the upper cladding layer comprising at least aluminum indium nitride (AlGaInN). The GaN template layer may be a bulk GaN substrate, or may be a GaN template layer formed over a sapphire ($Al_2O_3$) substrate. The active layer may, for example, comprise gallium indium nitride in the ratio of $Ga_{1-m}In_mN$, with $0.10 \leq m$. An electron blocking layer and waveguide may also be provided in certain embodiments. In other embodiments only one of the two cladding layers comprise AlGaInN while the other cladding layer comprises AlGaN. In yet other embodiments, the cladding layer disclosed herein may eliminate the need for the electron blocking layer.

The cladding layers may comprise bulk aluminum gallium indium nitride in the ratio of $Al_xGa_{1-x-y}In_yN$. In a special case, x+y=1, meaning the alloy contains no gallium. According to yet another aspect of the disclosure at least a portion of at least one of the cladding layers comprises a short period superlattice structure of, for example, a plurality of alternating sub-layer pairs of aluminum gallium indium nitride in the ratio of $Al_xGa_{1-x-y}In_yN$ and $Al_qGa_{1-p-q}In_pN$ where (p,q) are different from (x,y). A special case is q=0 where $Al_qGa_{1-p-q}In_pN$ is gallium indium nitride. The short period superlattice could further be designed so all or a portion of the cladding layer provides a multi-quantum barrier (MQB) effect.

According to a still further aspect of the disclosure, the lattice parameters may be selected to provide strain balanced MQBs, e.g., where the barrier layers are tensile-strained and the well layers compressed.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

Figure 1:
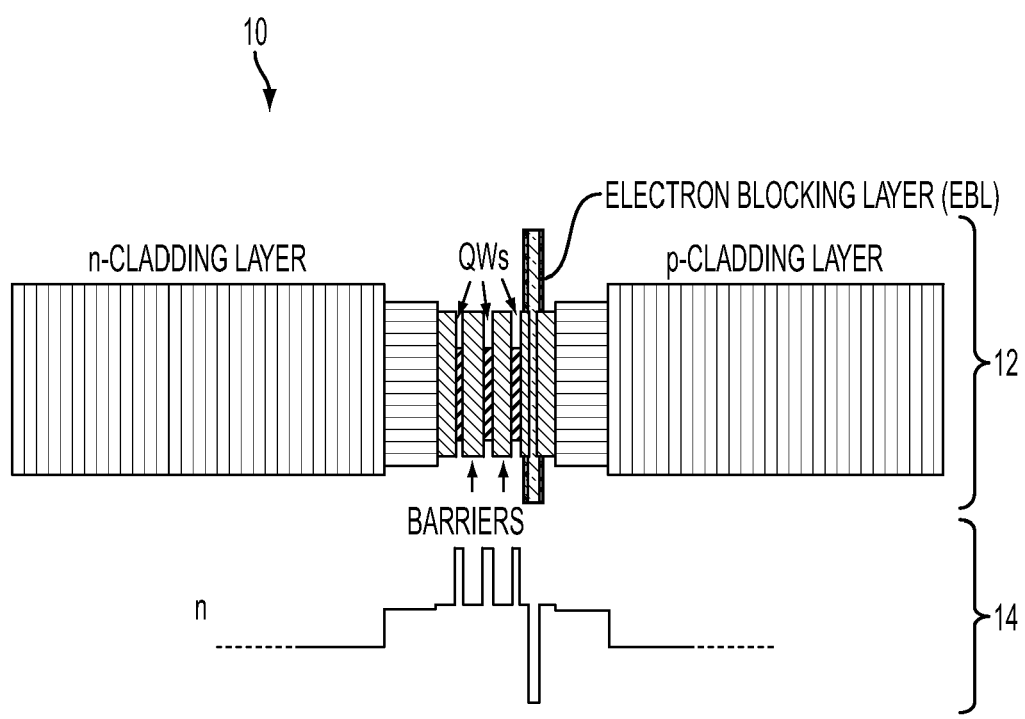
FIG. 1 is an illustration of device attributes of a generic nitride laser diode structure known in the art.
Figure 2:
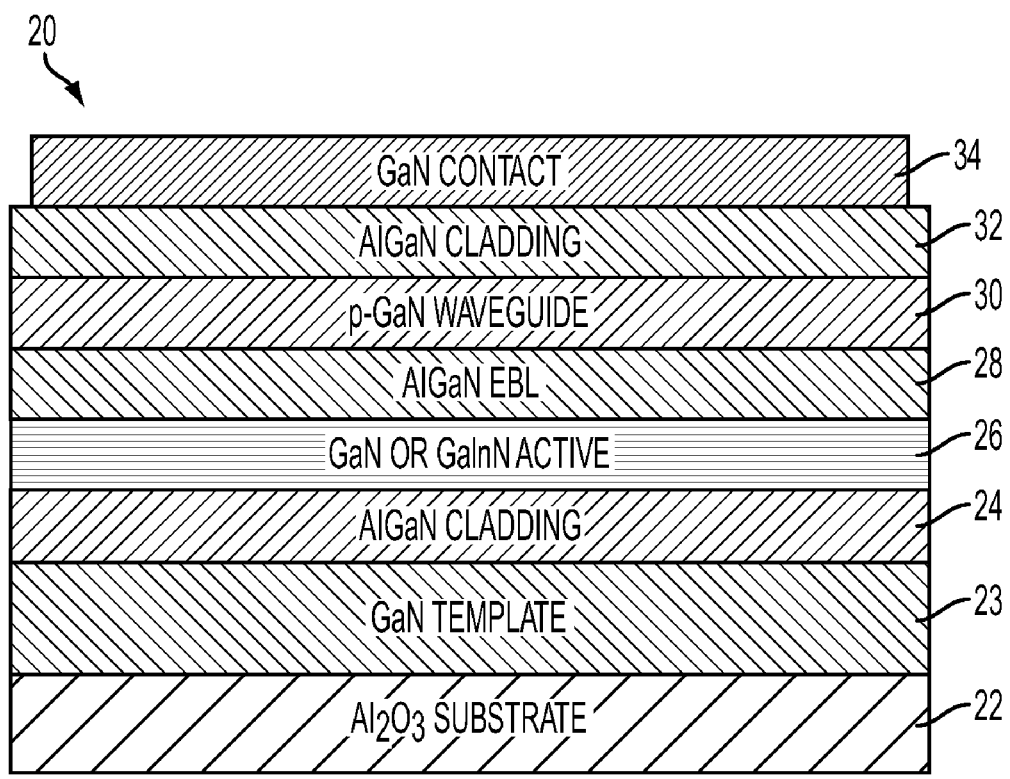
FIG. 2 is an illustration of a cross-section of a generic nitride laser diode structure known in the art.
Figure 3:
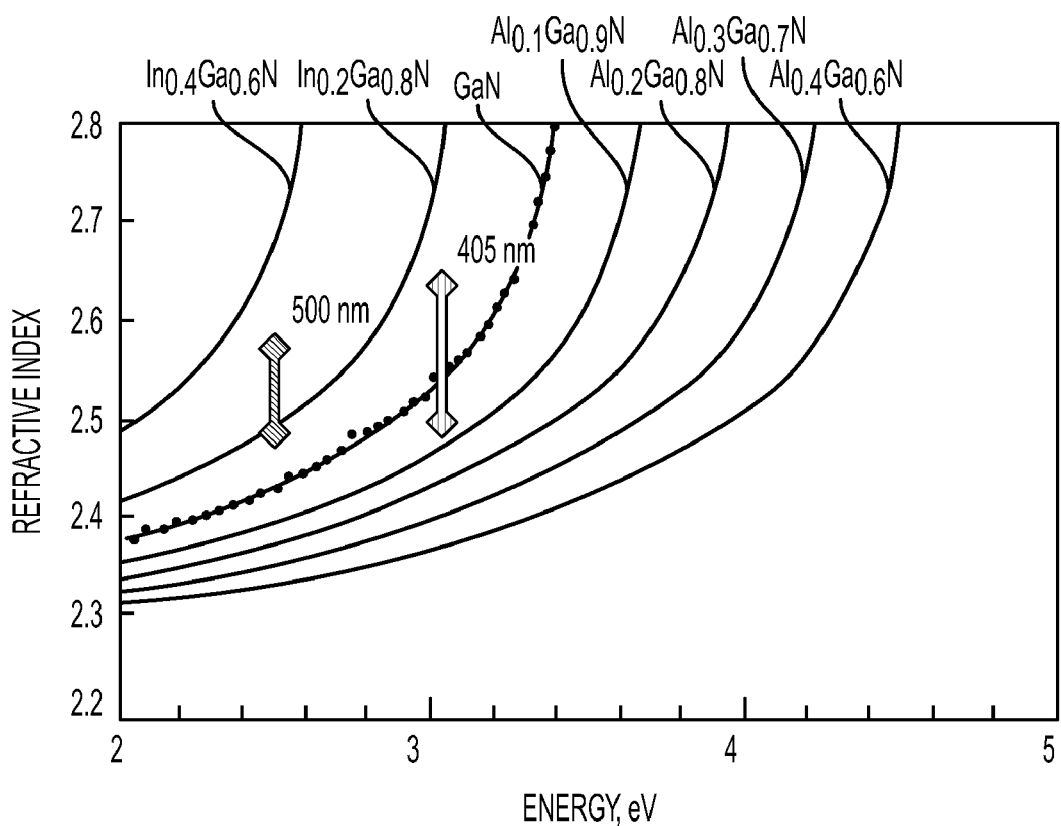
FIG. 3 is a graph of the dispersion (index vs. energy) for GaN, and families of GaInN and AlGaN alloys, for example as used in the cladding layer of known LD heterostructures.
Figure 4:
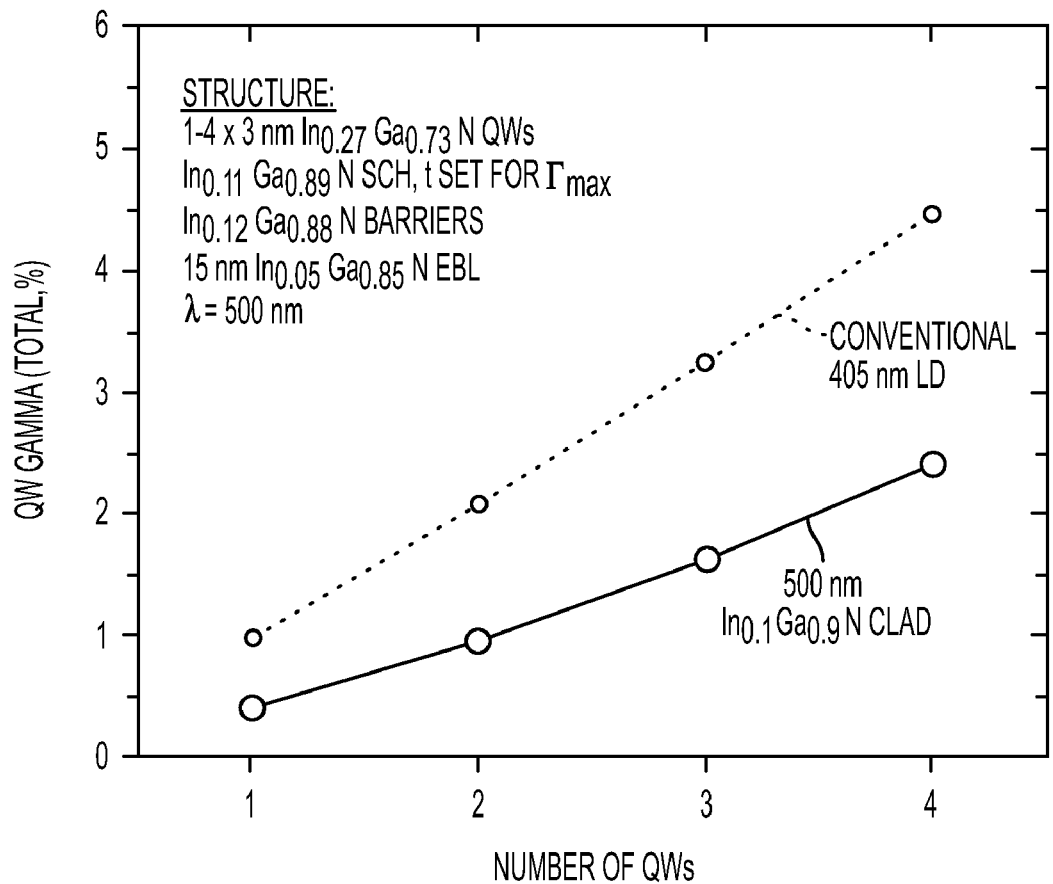
FIG. 4 is a graph of the aggregate maximum optical confinement factors Γ (Γ=spatial overlap of quantum wells and mode) for two laser structures, 405 nm emission and 500 nm emission, respectively.
Figure 5:
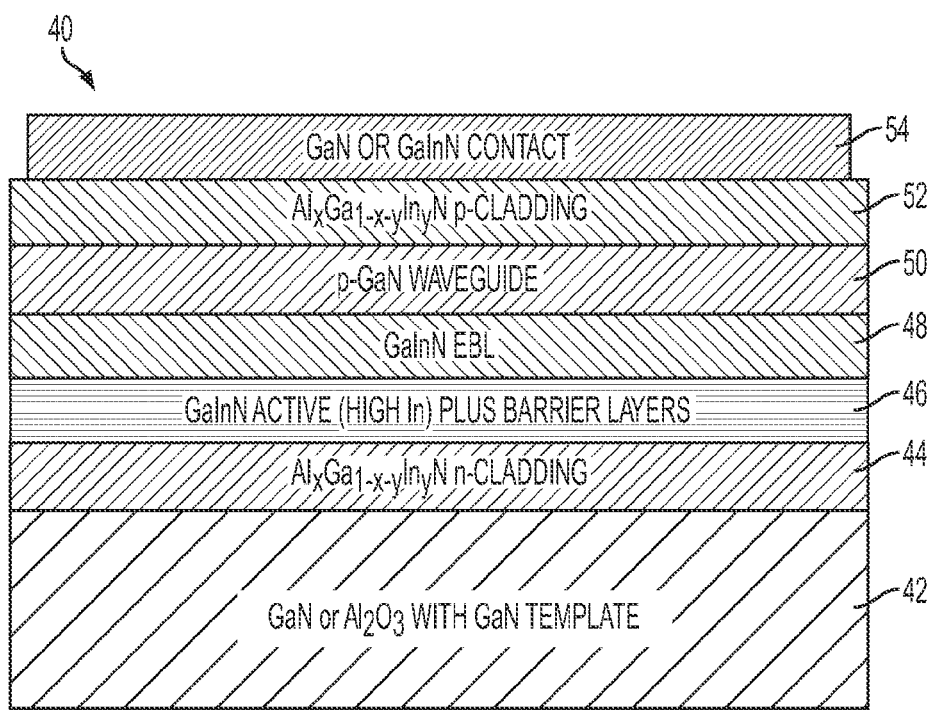
FIG. 5 is an illustration of a cross-section of a novel nitride laser diode structure according to one embodiment of the present invention.
Figure 6:
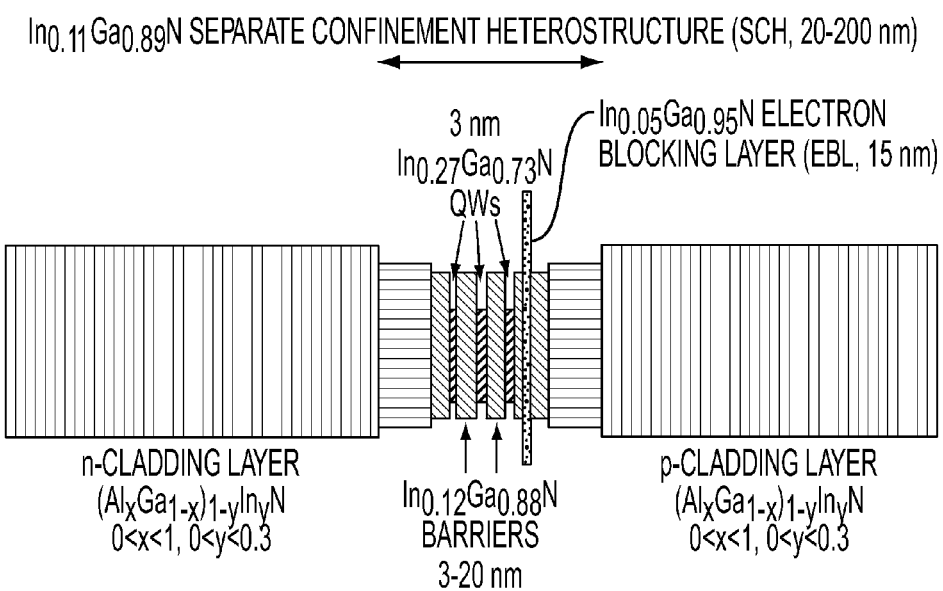
FIG. 6 is a band-gap energy illustration of one embodiment of a structure of the type shown in FIG. 5.

According to the present disclosure, a novel structure 40 for a semiconductor light emitting device is shown in FIG. 5 which overcomes many of the shortfalls described with respect to the prior art. Structure 40 is formed over a sapphire ($Al_2O_3$) or GaN substrate 42. If a sapphire substrate is employed, a GaN template layer (not shown) will typically be formed thereover to serve as a structural template for subsequent layers. A lower cladding layer 44, discussed in further detail below, is formed over substrate 42. A relatively high-In content MWQ active layer 46 such as GaInN, is formed over lower cladding layer 44. An optional GaInN EBL 48 is next formed, and waveguide 50 of GaN (for blue and blue-violet devices) or GaInN (for green devices) is formed thereover (or alternatively, thereunder). An upper cladding layer 52, discussed in further detail below, is next formed over waveguide 50. Finally, an appropriate ohmic contact 54, such as GaN or GaInN, is formed over upper cladding layer 52. FIG. 6 is a band-gap energy illustration of one embodiment of a structure of the type shown in FIG. 5.

It will be noted that one distinction structure 40 presents over the prior art structures is the inclusion of an aluminum indium nitride (AlInN) or aluminum gallium indium nitride (AlGaInN) cladding layers 44, 52 in place of one or both of the known aluminum gallium nitride (AlGaN) cladding layers. The lattice parameter presented by the AlInN or AlGaInN cladding layers can be chosen so it is similar to the lattice parameter presented by the AlGaN cladding layers of the prior art. We have found that this replacement provides a strong improvement in the optical confinement factor, while simultaneously addressing issues related to lattice mismatch.

Lattice parameter matching is important between the active layer 46 and, for example, cladding layers 44, 52. Matching the lattice parameter of the active layer and cladding layers minimizes the strain in the heterostructure, which in turn alleviates cracking and reduces or eliminates piezoelectric effects. In an alternative structure, lattice parameter matching is made between the substrate 42 and the cladding layers 44, 52. The lattice parameters (a) are known for the basic binaries GaN (a=0.3189 nm), InN (a=0.3533 nm), and AlN (a=0.3122 nm). Thus, the lattice parameter of $Al_xIn_yGa_{1-x-y}N$ is given by:

$$a_{AlGaInN} = x(0.3112) + y(0.3533) + (1 - x - y)(0.3189) \text{ nm} \quad (1)$$

$$= 0.3189 - 0.0077x + 0.0344y \text{ nm}$$

We will assume for one embodiment that the active layer comprises a nitride of ten percent (10%) indium and ninety percent (90%) gallium. The lattice parameter of this $Ga_{0.9}In_{0.1}N$ active layer can be found from the above as (x=0, y=0.1):

$$a_{GaInN} = 0.3189 - 0.0077(0) + 0.0344(0.1) \text{ nm} \quad (2)$$

$$= 0.3223 \text{ nm}$$

Next we would like to find conditions for x and y in the quaternary alloy $Al_xGa_{1-x-y}In_yN$ such that its lattice parameter can match that of the $Ga_{0.9}In_{0.1}N$ active layer (a=0.3223 nm). To do so, we set up the values as follows and solve, for example, for y:

$$0.3223 = 0.3189 - 0.0077x + 0.0344y$$

$$y = 0.1 + 0.2238x \quad (3)$$

This can now be generalized for any quaternary $Al_xGa_{1-x-y}In_yN$ alloy on a ternary $Ga_{1-m}In_mN$ alloy template. Doing so allows for the determination of the compositions of Al, In, and Ga in the cladding layer for a specified indium content in the active layer so as to provide lattice matching between the two. In general, the relationship is:

$$y = m + 0.2238x \quad (4)$$

Therefore, as the indium content in active layer 46 increases in order to increase the wavelength of the emitted light, the cladding layers should be tailored to minimize the undesirable cracking and piezoelectric effects associate with a poor lattice match between the layers. Again, due to the desire to improve carrier and optical confinement as the indium level increases, indium is introduced into the upper classing layer.

Figure 7:
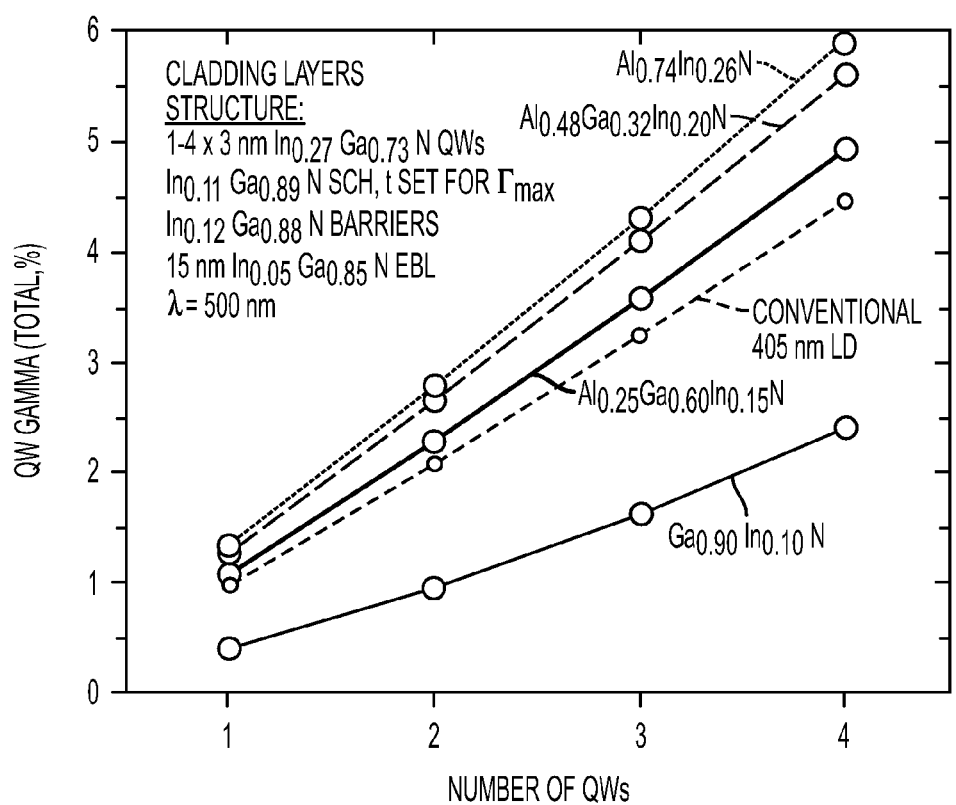
FIG. 7 is a graph of the total Γ (gamma) values which result when the ternary GaInN cladding layer is replaced with a quaternary AlGaIn cladding layers for lattice-matching to a high indium content GaInN active layer.

While we have discovered that the introduction of In into the cladding layers is beneficial, we have also determined that the heterostructure can be optimized by use of the quaternary $Al_xGa_{1-x-y}In_yN$ alloy as compared to the ternary GaInN. With reference to FIG. 7, the total Γ (gamma) values which result when the lower and upper $Ga_{0.9}In_{0.1}N$ cladding layers 44, 52 are replaced with $Al_{0.25}Ga_{0.60}In_{0.15}N$, $Al_{0.48}Ga_{0.32}In_{0.20}N$, and $Al_{0.74}In_{0.26}N$ cladding an alloy lattice-matched to $In_{0.1}Ga_{0.9}N$) are indicated. The structure, generally corresponding to FIG. 5, comprises:

TABLE 2

| | |
|---|---|
| Substrate | $Al_2O_3$ |
| Template layer | GaN |
| cladding | As indicated |
| SCH | $Ga_{0.89}In_{0.11}N$ |
| Barriers (10 nm) | $Ga_{0.88}In_{0.12}N$ |
| QWs (3 nm) | $Ga_{0.73}In_{0.27}N$ |
| EBL (15 nm) | $Al_{0.05}Ga_{0.95}N$ |

An increase in Γ indicates better optical confinement and wave guiding, which is desired in order that the optical efficiency, and ultimately the efficacy of the structure, are maximized. As can be seen in FIG. 7, while the ternary $Ga_{0.9}In_{0.1}N$ provides a lower Γ as compared to the conventional AlGaN cladding for a known 405 nm LD, with the inclusion of a combination of aluminum and indium comes the desired increase in Γ. This modification clearly produces a stronger transverse waveguide, thereby yielding total Γ values which are comparable to those achieved in conventional 405 nm LDs. Structures with improved optical confinement may thus be obtain for longer wavelength (e.g., blue, green, etc.) nitride laser diodes.

The refractive index values of AlGaInN alloys are not well established. Here, in order to perform this waveguide analysis, the index values were estimated using a variational approach which gives the change in index relative to GaN, based on the bandgap energy change (through the Kronig-Kramer relation). Specifically, the bandgap energy, $E_{AlGaInN}$, of the $(Al_xGa_{1-x})_{1-y}In_yN$ alloy was assumed to be a simple linear combination of the bandgap energies of $Al_{1-y}In_yN$ and $Ga_{1-y}In_yN$ ternaries, with s equal to the percentage AlInN, represented as:

$$E_{AlGaInN} = x^*E_{Al(1-y)In(y)N} + (1-x)^*E_{Ga(1-y)In(y)N} \quad (5)$$

The bandgap difference with respect to GaN implies an index change, according to the Kronig-Kramer relation. The GaN index and dispersion were fit with a first-order Sellmeier equation, then a simplified Kronig-Kramer relation was applied to determine the AlGaInN index and dispersion. This analysis may be checked by considering the limiting case of $Al_{0.82}In_{0.18}N$, which is lattice matched to GaN and has therefore been applied to AlInN—GaN distributed Bragg reflectors. In this case, an index contrast between $Al_{0.82}In_{0.18}N$ and GaN was experimentally determined to be 6-8% at a wavelength of 420 nm. In comparison, the simulation described above slightly underestimates the index, giving a contrast of 5.8%. However, this is adequate to support the general relationship of bandgap energies shown above.

Figure 8:
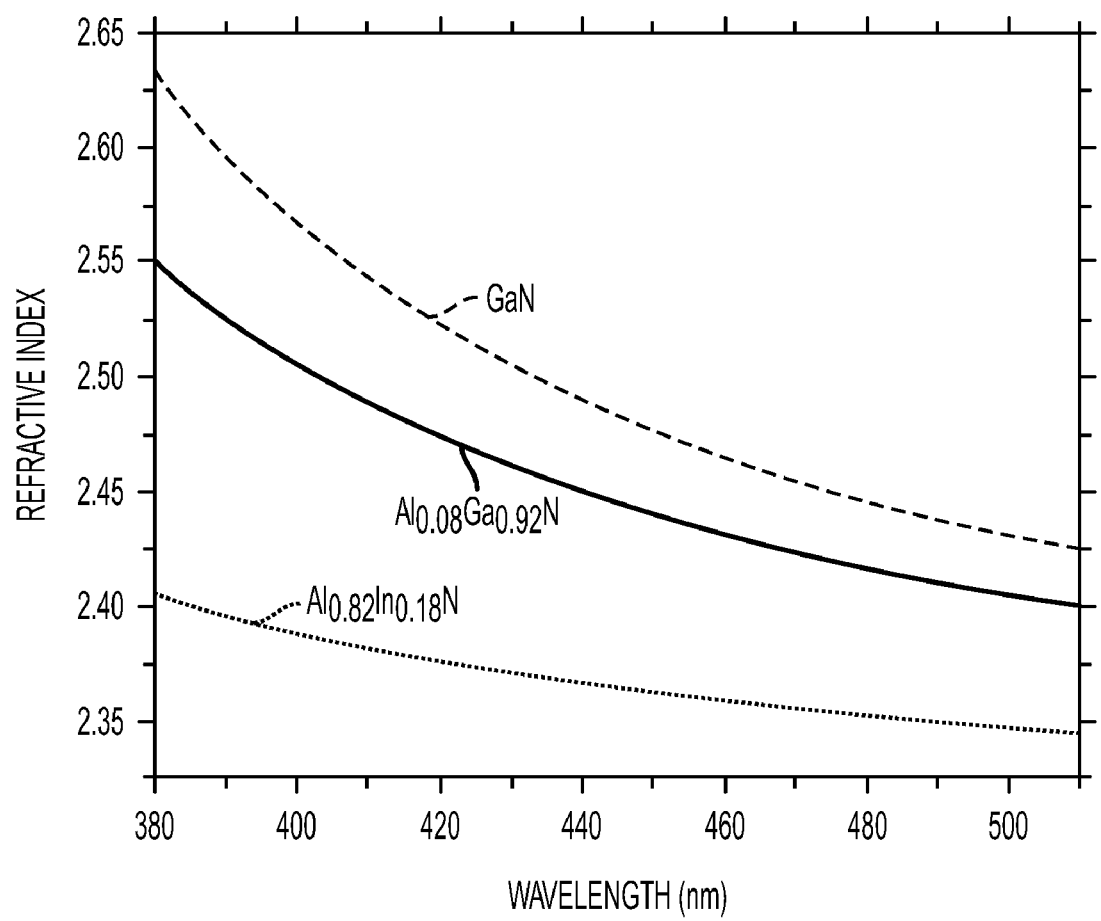
FIG. 8 shows the dispersion characteristics of a $Al_{0.82}In_{0.18}N$ cladding layer lattice-matched to a GaN substrate or template according to one embodiment of the present invention as compared to that of a traditional cladding layer alloy $Al_{0.08}Ga_{0.92}N$ and a GaN layer.

FIG. 8 shows the dispersion characteristics of a $Al_{0.82}In_{0.18}N$ cladding layer lattice-matched to GaN according to one embodiment of the present invention as compared to that of a traditional cladding layer alloy $Al_{0.08}Ga_{0.92}N$ and a GaN layer. These index values were computed using the above described method. It can be seen from FIG. 8 that the index value for lattice-matched $Al_{0.82}In_{0.18}N$ is significantly lower than for the commonly-employed $Al_{0.08}Ga_{0.92}N$ alloy.

Figure 9:
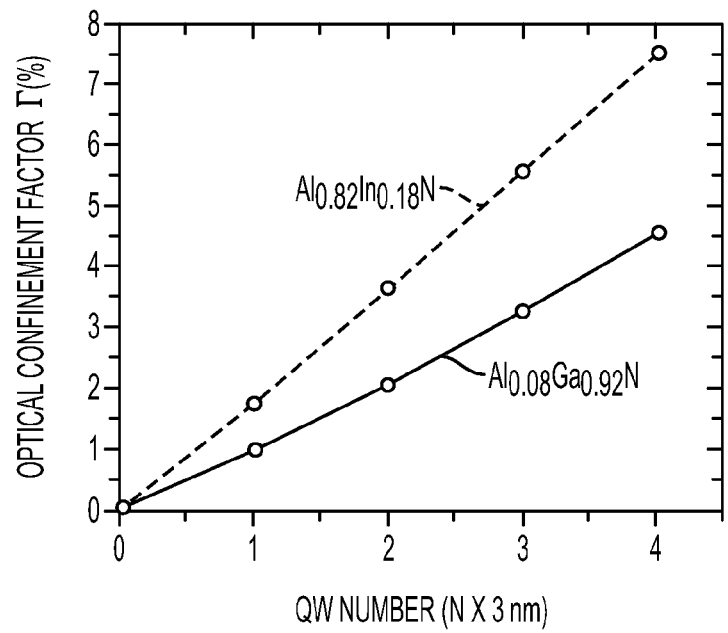
FIG. 9 is a graph of the optical confinement factor, Γ, varies for different cladding layer compositions and number of quantum wells in the active layer.

With reference next to FIG. 9, it can be seen that the lowering of the index (as demonstrated in FIG. 8) produces stronger optical confinement (high Γ). Moreover, the $Al_{0.92}In_{0.18}N$ alloy is unstrained with respect to the underlying GaN template. Consequently, it may be made arbitrarily thick, since cracking is eliminated in unstrained films.

The lower index of AlInN translates into stronger optical confinement. FIG. 9 shows how the maximum optical confinement factor (Γ) is improved for the proposed AlInN cladding layer compared to the traditional AlGaN cladding layer. This simulation assumes N (N=1, 2, 3, or 4 quantum wells)× 3/10 nm $Ga_{0.9}In_{0.1}N$/GaN QWs embedded in a GaN separate confinement heterostructure (SCH) clad by either AlGaN or AlInN, a wavelength λ=410 nm; and the thickness of the SCH layers are optimized for maximum Γ. The AlInN cladding layer clearly enhances optical confinement, for lower threshold current.

Figure 10:
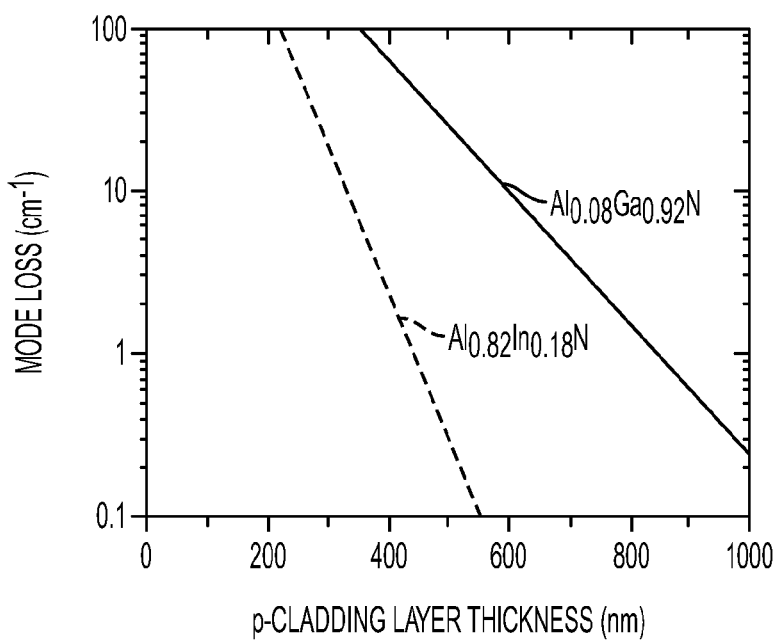
FIG. 10 is a graph of the mode loss versus cladding layer thickness for the cladding layer compositions illustrated in FIG. 9.

Similarly, the stronger optical confinement provided by an AlInN cladding layer can also reduce mode loss, as indicated in FIG. 10, which simulates the mode loss arising from absorption in a titanium contact metal (n=2+2i at 410 nm), for a structure with 2×3 nm $Ga_{0.9}In_{0.1}N$ QWs, 2×80 nm GaN SCH layers, surrounded by either AlGaN and AlInN cladding layers, respectively. As the thickness of the p-cladding layer is reduced, the evanescent tail of the optical mode may interact more strongly with the titanium contact metal, thereby leading to high modal absorption loss. This loss is greatly reduced for an AlInN cladding layer. In a similar manner, the low index of AlInN compared to AlGaN reduces any additional mode loss associated with the magnesium-doped layers. The reduced loss leads to lower threshold and higher efficiency.

Figure 11:
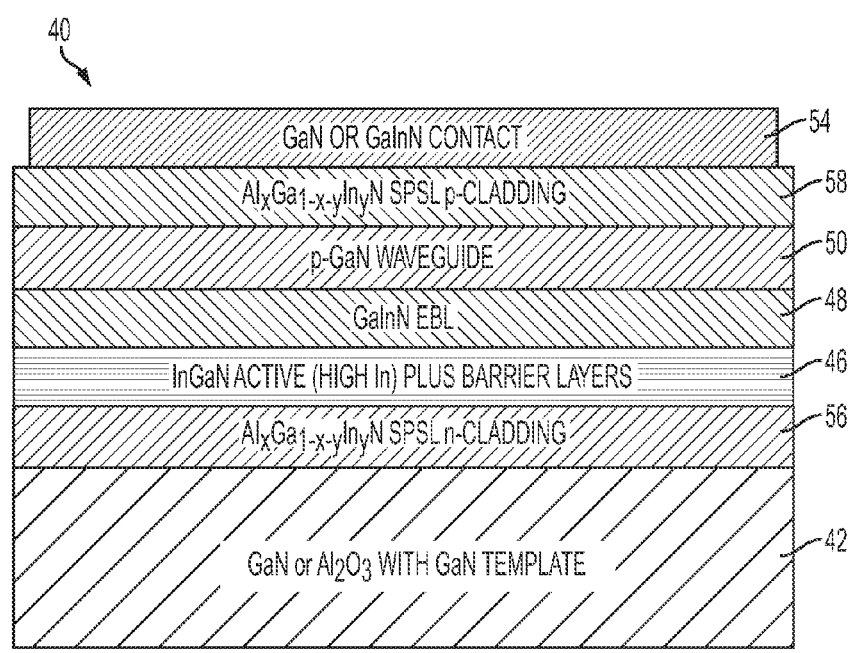
FIG. 11 is an illustration of a cross-section of a novel nitride laser diode structure according to another embodiment of the present invention.

Further benefit may be obtained by replacing the bulk AlGaInN cladding layers 44, 52 shown in FIG. 5 with short-period superlattice (SPSL) cladding layers 56, 58, respectively, as shown in FIG. 11. First, as documented for conventional 405 nm laser structures, a SPSL cladding layer minimizes cracking, and improves conductivity of the cladding layer (a consequence of the modulation-doping effect, and the beneficial impact of interface polarization charge). For p-doping, it is beneficial to modulation-dope the superlattice where the low bandgap component of the superlattice is more heavily doped than the higher bandgap component. In addition, a SPSL cladding layer may be employed to improve carrier confinement, through the MQB (multi-quantum barrier) effect. For a proper design of the short-period superlattice, a quantum-mechanical reflection occurs, which serves to enhance the confinement of injected carriers, by suppressing leakage into the cladding layers.

Figure 12:
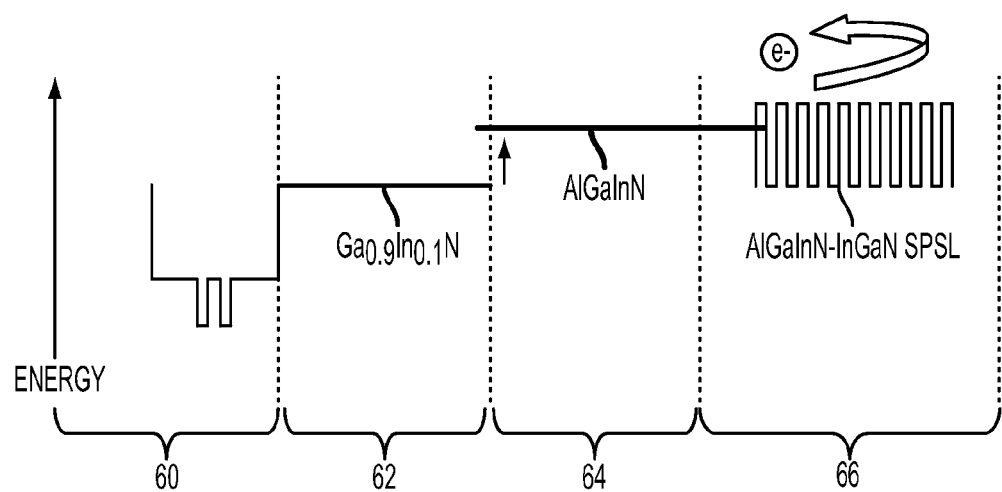
FIG. 12 is an energy band diagram illustrating multi-quantum barrier (MQB) quantum-mechanical reflection provided by short period super lattice cladding layers, in comparison with the bulk GaInN and AlGaInN cladding layers.
Figure 13A:
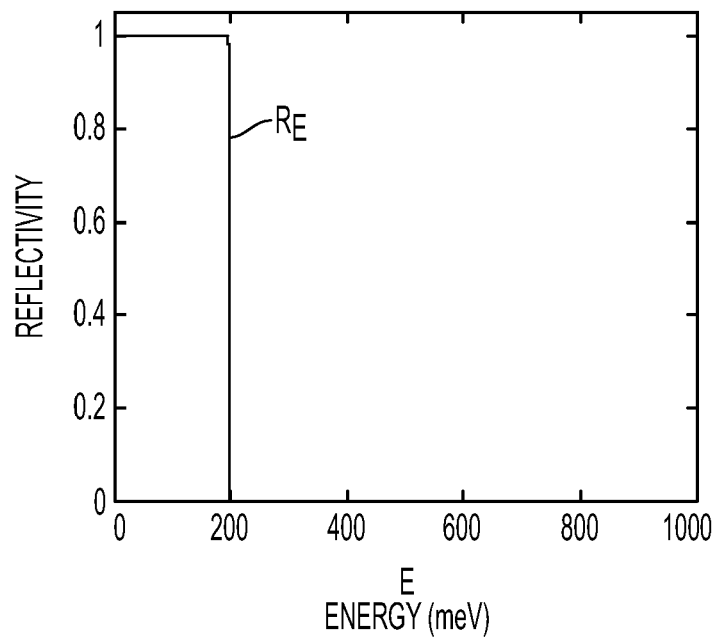
FIGS. 13A-13F are electron reflectivity spectra for several examples of p-cladding layers, including embodiments according to the present invention.
Figure 13B:
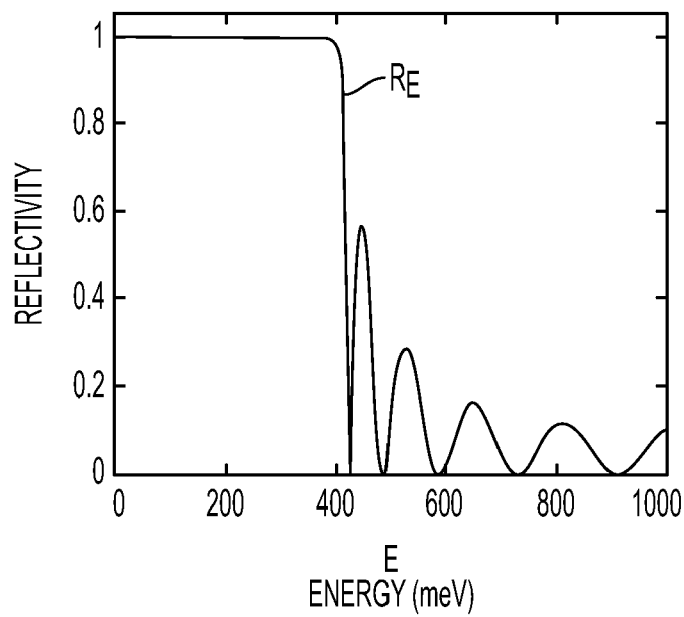
Figure 13C:
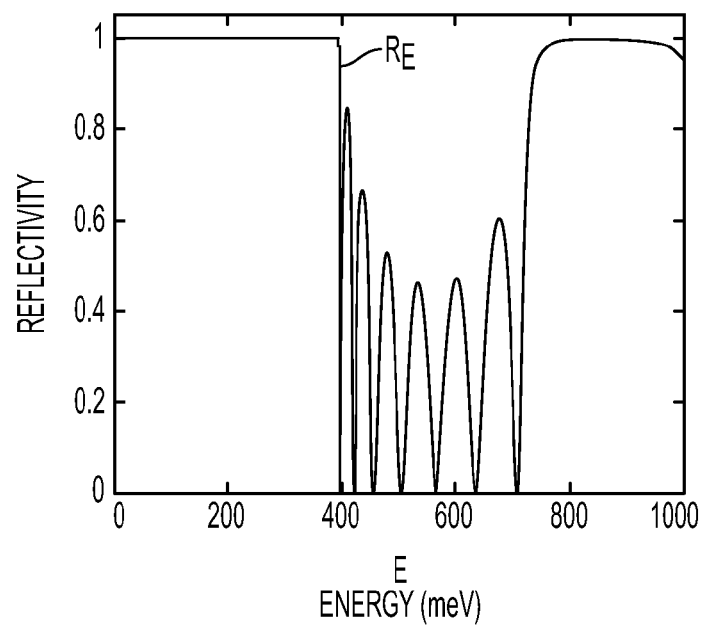
Figure 13D:
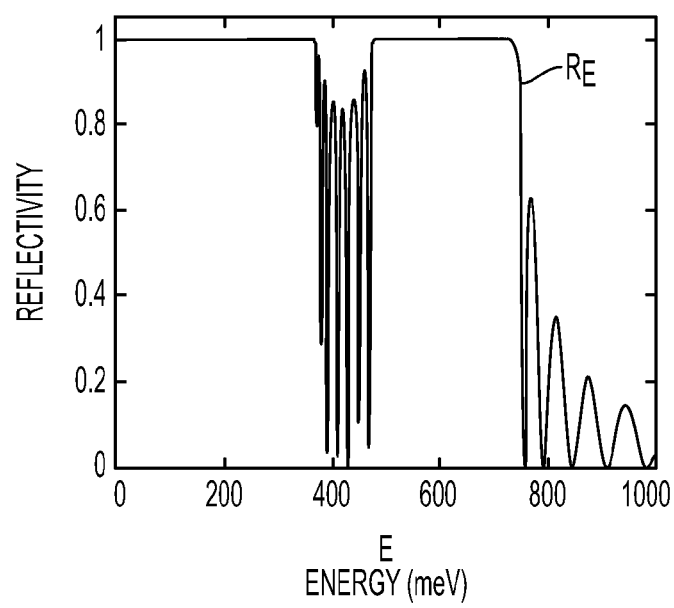
Figure 13E:
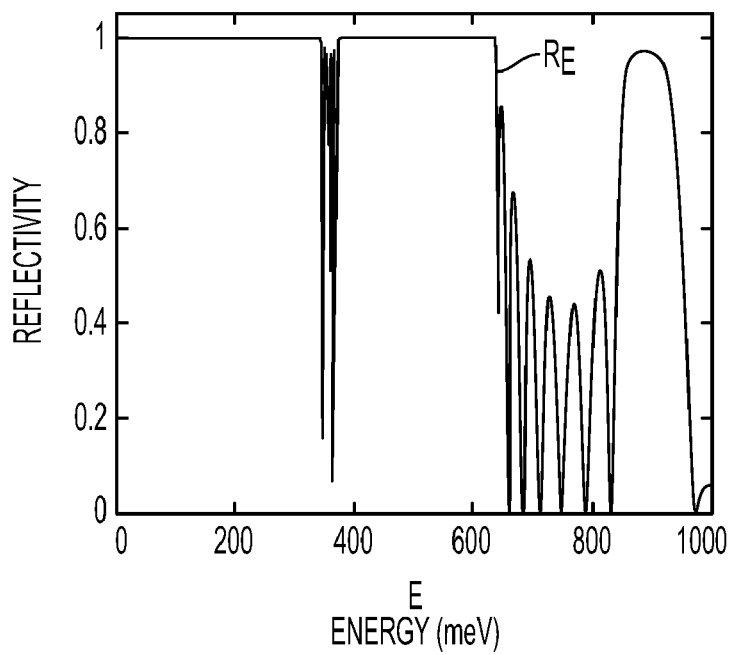
Figure 13F:
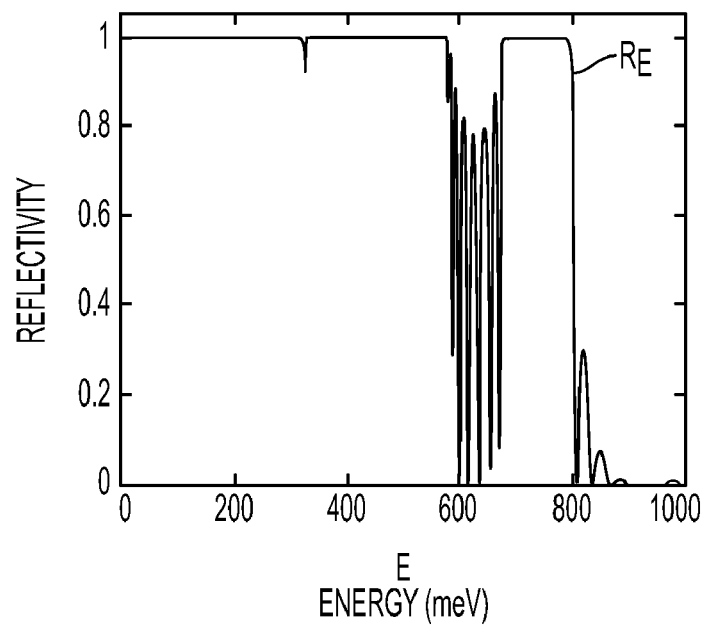

An energy band diagram illustrating quantum-mechanical reflection provided by the SPSL cladding layers is shown in FIG. 12, in comparison with the bulk GaInN and AlGaInN cladding layers described above. Region 60 represents the active layer 46 of FIG. 11. Three candidate cladding layer structures are illustrated adjacent region 60. They are GaInN in region 62, higher band gap and lower index bulk AlGaInN in region 64 for improved optical confinement, and a SPSL of alternating sublayers of $Al_xGa_{1-x-y}In_yN$ and $Ga_sIn_{1-s}N$ in region 66 for further enhanced carrier confinement through multi-quantum barrier (MQB) effect.

The design of the MQB is governed by the carrier effective masses and the band offsets, which together with the layer thicknesses and compositions, determine the electron reflectivity spectrum. Examples of several electron reflectivity spectra for various p-cladding layers are shown in FIGS. 13A-13F. Table 3 correlates the various FIGS. 13A-13F to their respective cladding layer MQB sublayer thicknesses.

TABLE 3

| FIG. | MQB well ($t_w$) sublayer and barrier ($t_B$) sublayer thicknesses |
|---|---|
| 13A | $T_W = 0$ |
|  | $T_B = 0$ |
|  | (No MQB) |
| 13B | $T_W = 0.6$ nm |
|  | $T_B = 0.6$ nm |
| 13C | $T_W = 1.0$ nm |
|  | $T_B = 1.0$ nm |
| 13D | $T_W = 1.5$ nm |
|  | $T_B = 1.5$ nm |
| 13E | $T_W = 2.0$ nm |
|  | $T_B = 2.0$ nm |
| 13F | $T_W = 2.5$ nm |
|  | $T_B = 2.5$ nm |

Here, the p-type MQB is constructed of lattice-matched $Ga_{0.9}In_{0.1}N$ well layers and $Al_{0.74}In_{0.26}N$ barrier layers. Their bandgap energies differ by approximately 700 meV; and we assume that this difference is distributed in a ratio of 60:40 between the conduction and valence bands. The electron effective mass is assumed to be 0.2 $m_o$, and spontaneous polarization differences at the interfaces are ignored. The zero of energy is arbitrarily set at 200 meV, corresponding to the conduction band edge of the GaInN well layer. With a band offset of 424 meV, the AlInN conduction band energy then lies at 624 meV.

The six spectra in FIGS. 13A-13F show the effect of layer thickness on the reflectivity spectra. In this case, for simplicity the well and barrier thicknesses are assumed equal, so that the average composition is $(Al_{0.5}Ga_{0.5})_{0.82}In_{0.18}N$. Since the MQB layers are so thin (far thinner than the size of the optical mode), the refractive index may be assumed to be an average value between the GaInN and AlInN components of the alloy. Thus, the optical confinement factor for this structure lies between the curves for $Al_{0.26}Ga_{0.60}In_{0.16}N$ and $Al_{0.48}Ga_{0.32}In_{0.20}N$ in FIG. 7, and is therefore within a desired operational range.

For no MQB (i.e., bulk GaInN cladding layer), no coherent reflections occur, and the classical barrier height of 200 meV is obtained. As the MQB sublayer thicknesses are adjusted, the reflectivity spectrum shows the presence of transmission resonances and reflection bands (i.e., mini-bands for which total reflection occurs). For a proper design of MQB, the reflectivity is near 100% for a range of energies extending from the classical barrier height (200 meV), to much higher energies. For example, in the case of $t_W=t_B=2.5$ nm (for p-type upper cladding layer with total MQB thickness $t_U=t_W+t_B$), illustrated in FIG. 13F, the reflectivity is near-unity for all electrons up to an energy of about 600 meV. Similar design considerations apply to the lower n-cladding layer (with total MQB thickness $t_L=t_W+t_B$ for that lower n-cladding layer), for which hole reflectivity must be maximized over a wide range of energies. In the case of these hole-reflectivity simulations, a higher effective mass and lower band offsets represent the valence band structure.

The well and barrier cladding layers 56, 58 need not be constrained to be equal in thicknesses, as in the example above. In general, the optimum MQB cladding layer design produces a broad reflectivity spectrum, while also having a weighted-average refractive index that produces strong optical confinement (compared to an GaInN cladding layer). Likewise, the compositions are also not constrained to be lattice-matched; and strain-balanced structures are equally viable and potentially superior in certain applications. For example, an MQB cladding layer may be constructed from layers of $Ga_{0.85}In_{0.15}N$ and $Al_{0.78}In_{0.22}N$, in which case the GaInN alloy is compressively strained +0.5% with respect to $Ga_{0.9}In_{0.1}N$, and the AlInN is tensile strained (−0.5%) by the same magnitude. If an MQB is formed from equal-thickness layers of these materials, the average lattice parameter will be equivalent to that of $Ga_{0.9}In_{0.1}N$, as for the example represented in FIGS. 13A-13F. However, the reflectivity spectra would exhibit much greater range of energy for which the reflectivity approaches unity, because the band offset for this pair of materials is nearly double that for the lattice-matched MQB structure discussed above.

Thus, there is considerable flexibility in the MQB cladding layer design. Any set of compositions and thicknesses which comprise a weighted-average strain balance are possible. The optimum structure has a low refractive index for strong optical confinement, and the layer thicknesses and compositions are strain-balanced and yield an electron reflectivity spectrum with near-unity reflectivity extending to energies well over the classical barrier height. Strain balanced MQBs, where the barrier layers are tensile-strained and the well layers compressive-strained, may offer enhanced confinement due to their greater band offsets.

Furthermore, the MQB need not comprise the full cladding layer. Rather, the cladding layer could be a composite structure formed from a combination of bulk AlGaInN, combined with a SPSL-MQB near the active region for improved carrier confinement. The MQB may also eliminate the need for the typical electron-blocking layer (EBL, comprised of 15-20% bulk AlGaN in a conventional 405 nm laser). As a still further alternative embodiment, the EBL may be replaced with a MQB-EBL.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A semiconductor laser structure, comprising:
   a gallium nitride (GaN) template layer;
   a lower cladding layer formed over said gallium nitride (GaN) template layer, said lower cladding layer comprising at least aluminum gallium indium nitride (AlGaInN);
   an active layer comprised of gallium indium nitride (GaInN) formed over said lower cladding layer; and
   an upper cladding layer comprising at least aluminum gallium indium nitride (AlGaInN);
   whereby the active layer is substantially lattice matched to the lower cladding layer; and
   wherein at least one of said lower and said upper cladding layers comprise aluminum indium nitride substantially in the ratio of $Al_{0.74}In_{0.26}N$, and said active layer comprises a plurality of quantum well sublayers each comprising gallium indium nitride substantially in the ratio of $Ga_{0.73}In_{0.27}N$, each quantum well sublayer separated from another by a barrier sublayer comprising resin gallium indium nitride substantially in the ratio of $Ga_{0.88}In_{0.12}N$.

2. A semiconductor laser structure, comprising:
   a gallium nitride (GaN) template layer;
   an n-type lower cladding layer formed over said gallium nitride (GaN) template layer, said lower cladding layer comprising at least aluminum gallium indium nitride (AlGaInN) in the ratio of $Al_xGa_{1-x-y}In_yN$;
   an active layer comprised of gallium indium nitride (GaInN) formed over said lower cladding layer; and a p-type upper cladding layer comprising at least aluminum gallium indium nitride (AlGaInN) in the ratio of $Al_xGa_{1-x-y}In_yN$;

whereby the active layer is substantially lattice matched to the lower cladding layer; and in which, for at least one of said lower and upper cladding layers, $0.25 \leq x \leq 0.48$ and $0.15 \leq y \leq 0.02$.

3. A semiconductor laser structure, comprising:

a gallium nitride (GaN) template layer;

an n-type lower cladding layer formed over said gallium nitride (GaN) template layer, said lower cladding layer comprising at least a single layer of aluminum gallium indium nitride (AlGaInN) in the ratio of $AlGa_{1-x-y}In_yN$;

an active layer comprised of gallium indium nitride (GaInN) formed over said lower cladding layer; and a p-type upper cladding layer comprising at least aluminum gallium indium nitride (AlGaInN) in the ratio of $Al_xGa_{1-x-y}In_yN$;

whereby the active layer is substantially lattice matched to the lower cladding layer; and wherein said active layer and each of said lower cladding layer and said upper cladding layer have a lattice parameter, and wherein said active layer comprises gallium indium nitride in the ratio of $Ga_{1-m}In_mN$, m determined as a function of the composition of said lower and upper cladding layers according to the relationship:

$$y = m + 0.2238 \cdot x$$

to thereby provide matching of the lattice parameters of said active layer and said lower and upper cladding layers.

4. The semiconductor laser structure of claim 3, wherein said active layer comprises gallium indium nitride in the ratio of $Ga_{0.9}In_{0.010}N$, and further wherein x and y are selected such that they substantially satisfy:

$$y = 0.1 + 0.2238 \cdot x$$

to thereby provide matching of the lattice parameters of said active layer and said lower and upper cladding layers.

5. A semiconductor laser structure, comprising:

a gallium nitride (GaN) template layer;

a lower cladding layer formed over said gallium nitride (GaN) template layer, said lower cladding layer comprising at least aluminum gallium indium nitride (AlGaInN);

an active layer comprised of gallium indium nitride (GaInN) formed over said lower cladding layer; and an upper cladding layer comprising at least aluminum gallium indium nitride (AlGaInN);

whereby the active layer is substantially lattice matched to the lower cladding layer;

wherein at least a portion of at least one of said lower and said upper cladding layers comprise a short-period superlattice structure having a plurality of alternating sublayer pairs of aluminum gallium indium nitride in the ratio of $Al_xGa_{1-x-y}In_yN$ and gallium indium nitride in the ratio of $Al_gGa_{1-p-q}In_pN$; and wherein said aluminum gallium indium nitride form well sublayers and said gallium indium nitride form barrier sublayers, and further wherein said at least one of said lower and said upper cladding layers comprising a multi-quantum barrier (MQB) short-period superlattice structure is a strain balanced structure in which said barrier sublayers are tensile-strained and said well sublayers are compressive-strained.

6. A semiconductor laser structure, comprising:

a gallium nitride (GaN) template layer;

a lower cladding layer formed over said gallium nitride (GaN) template layer, said lower cladding layer comprising at least aluminum gallium indium nitride (AlGaInN);

an active layer comprised of gallium indium nitride (GaInN) formed over said lower cladding layer; and an upper cladding layer comprising at least aluminum gallium indium nitride (AlGaInN);

whereby the active layer is substantially lattice matched to the lower cladding layer;

wherein at least a portion of at least one of said lower and said upper cladding layers comprise a short-period superlattice structure having a plurality of alternating sublayer pairs of aluminum gallium indium nitride in the ratio of $Al_xGa_{1-x-y}In_yN$ and gallium indium nitride in the ratio of $Al_gGa_{1-p-q}In_pN$; and wherein said lower cladding layer is bulk aluminum gallium indium nitride and said upper cladding layer is a short-period superlattice structure having a plurality of alternating layer pairs of aluminum gallium indium nitride in the ratio of $Al_xGa_{1-x-y}In_yN$ and gallium indium nitride in the ratio of $Ga_sIn_{1-s}N$, providing a multi-quantum barrier (MQB) effect.

\* \* \* \* \*